(12) United States Patent
Kim et al.

(10) Patent No.: US 9,461,099 B2
(45) Date of Patent: Oct. 4, 2016

(54) DONOR MASK, METHOD OF MANUFACTURING ORGANIC LIGHT-EMITTING DISPLAY APPARATUS BY USING THE SAME, AND ORGANIC LIGHT-EMITTING DISPLAY APPARATUS

(71) Applicant: Samsung Display Co., Ltd., Yongin (KR)

(72) Inventors: Taegyun Kim, Yongin (KR); Taewook Kang, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/606,655

(22) Filed: Jan. 27, 2015

(65) Prior Publication Data

US 2016/0049450 A1    Feb. 18, 2016

(30) Foreign Application Priority Data

Aug. 12, 2014 (KR) .................. 10-2014-0104531

(51) Int. Cl.
*H01L 21/00* (2006.01)
*H01L 27/32* (2006.01)
*H01L 51/56* (2006.01)
*H01L 51/00* (2006.01)

(52) U.S. Cl.
CPC ....... *H01L 27/3246* (2013.01); *H01L 51/0013* (2013.01); *H01L 51/56* (2013.01); *H01L 27/3223* (2013.01)

(58) Field of Classification Search
CPC ........... H01L 51/0013; H01L 27/3246; H01L 51/56; H01L 2251/5315; H01L 27/3211; H01L 51/5012; H01L 27/3283; H01L 27/3295; H01L 51/0011; H01L 51/0002; H01L 51/0003; H01L 51/0004; H01L 51/0008; H01L 27/3223; H01L 51/5206; H01L 51/05; H01L 33/0079; H01L 27/1214; H01L 27/3244; H01L 33/22
USPC .............. 257/40, 98, E21.158, E33.067, 257/E33.061, E51.022; 438/29, 98–99, 438/149, FOR. 157, FOR. 287
See application file for complete search history.

(56) References Cited

U.S. PATENT DOCUMENTS

| | | | |
|---|---|---|---|
| 2003/0146692 A1* | 8/2003 | Uchida | H01L 51/56 313/504 |
| 2009/0075214 A1 | 3/2009 | Hirakata et al. | |
| 2009/0104835 A1 | 4/2009 | Aoyama et al. | |
| 2009/0104838 A1 | 4/2009 | Manrique | |
| 2009/0142510 A1* | 6/2009 | Takahashi | B32B 3/10 427/557 |
| 2010/0084676 A1 | 4/2010 | Tanaka | |
| 2010/0181559 A1* | 7/2010 | Nakatani | H01L 27/3246 257/40 |
| 2012/0097926 A1* | 4/2012 | Park | H01L 51/0013 257/40 |
| 2012/0326201 A1* | 12/2012 | Ohnuma | H01L 51/0085 257/99 |
| 2013/0011943 A1* | 1/2013 | Tsuruoka | C23C 14/04 438/22 |

FOREIGN PATENT DOCUMENTS

| | | |
|---|---|---|
| JP | 2010-093068 | 4/2010 |
| KR | 10-2009-0028413 | 3/2009 |

* cited by examiner

*Primary Examiner* — Thao X Le
*Assistant Examiner* — Nduka Ojeh
(74) *Attorney, Agent, or Firm* — H.C. Park & Associates, PLC

(57) ABSTRACT

A donor mask and a method of manufacturing an organic light-emitting display apparatus by using the donor mask. The method includes transferring a portion corresponding to a through hole of a transferring layer deposited on a light-to-heat conversion layer of the donor mask onto at least a portion of pixel electrodes on a substrate.

7 Claims, 7 Drawing Sheets

DONOR MASK, METHOD OF MANUFACTURING ORGANIC LIGHT-EMITTING DISPLAY APPARATUS BY USING THE SAME, AND ORGANIC LIGHT-EMITTING DISPLAY APPARATUS

CROSS-REFERENCE TO RELATED APPLICATION

This application claims priority from and the benefit of Korean Patent Application No. 10-2014-0104531, filed on Aug. 12, 2014, in the Korean Intellectual Property Office, which is hereby incorporated by reference for all purposes as if fully set forth herein.

BACKGROUND

1. Field

Exemplary embodiments relate to a donor mask, a method of manufacturing an organic light-emitting display apparatus by using the donor mask, and an organic light-emitting display apparatus. More particularly, exemplary embodiments relate to a donor mask that facilitates the manufacture of an organic light-emitting display apparatus having a reduced occurrence rate of defects and more uniform quality, a method of manufacturing an organic light-emitting display apparatus by using the donor mask, and an organic light-emitting display apparatus.

2. Discussion of the Background

An organic light-emitting display apparatus is a display apparatus including an organic light-emitting device (OLED) in a display area, and the OLED includes a pixel electrode and an opposite electrode facing each other, and an intermediate layer interposed between the pixel and opposite electrodes and including an light emitting layer.

During manufacture of an organic light-emitting display apparatus, various methods may be used to form the light emitting layer, and examples of the methods are a deposition method, an inkjet printing method, etc.

However, when the organic light-emitting display apparatus is manufactured by one of these conventional methods, a process of forming a light emitting layer is complicated, or an occurrence rate of defects is great.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a donor mask that facilitates the manufacture of an organic light-emitting display apparatus that has a reduced occurrence rate of defects and more uniform quality.

Exemplary embodiments also provide a method of manufacturing an organic light-emitting display apparatus by using the donor mask.

Exemplary embodiments also provide an organic light-emitting display apparatus manufactured by using the method disclosed herein.

Additional aspects will be set forth in part in the description which follows and, in part, will be apparent from the description, or may be learned by practice of the disclosed embodiments.

An exemplary embodiment of the present invention discloses a method of manufacturing an organic light-emitting display apparatus including: preparing a substrate on which a plurality of pixel electrodes are formed; preparing a donor mask including a base substrate, a light-to-heat conversion layer disposed on the base substrate and having an opening or a groove formed in a surface facing away from the base substrate, and a reflective layer interposed between the base substrate and the light-to-heat conversion layer and having a through hole; depositing a transferring layer on the light-to-heat conversion layer of the donor mask; aligning the donor mask with the substrate; and transferring a part of the transferring layer corresponding to the through hole onto at least a portion of the plurality of pixel electrodes formed on the substrate.

An exemplary embodiment of the present invention also discloses an organic light-emitting display apparatus including: a pixel electrode disposed on a substrate; a pixel-defining layer covering an edge of the pixel electrode; a spacer disposed on the pixel-defining layer, the spacer having a width less than a width of the pixel-defining layer; a light emitting layer disposed on the pixel electrode; and a dummy light emitting layer disposed on a side of the spacer in a direction toward the pixel electrode, the dummy light emitting layer comprising the same material as the light emitting layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
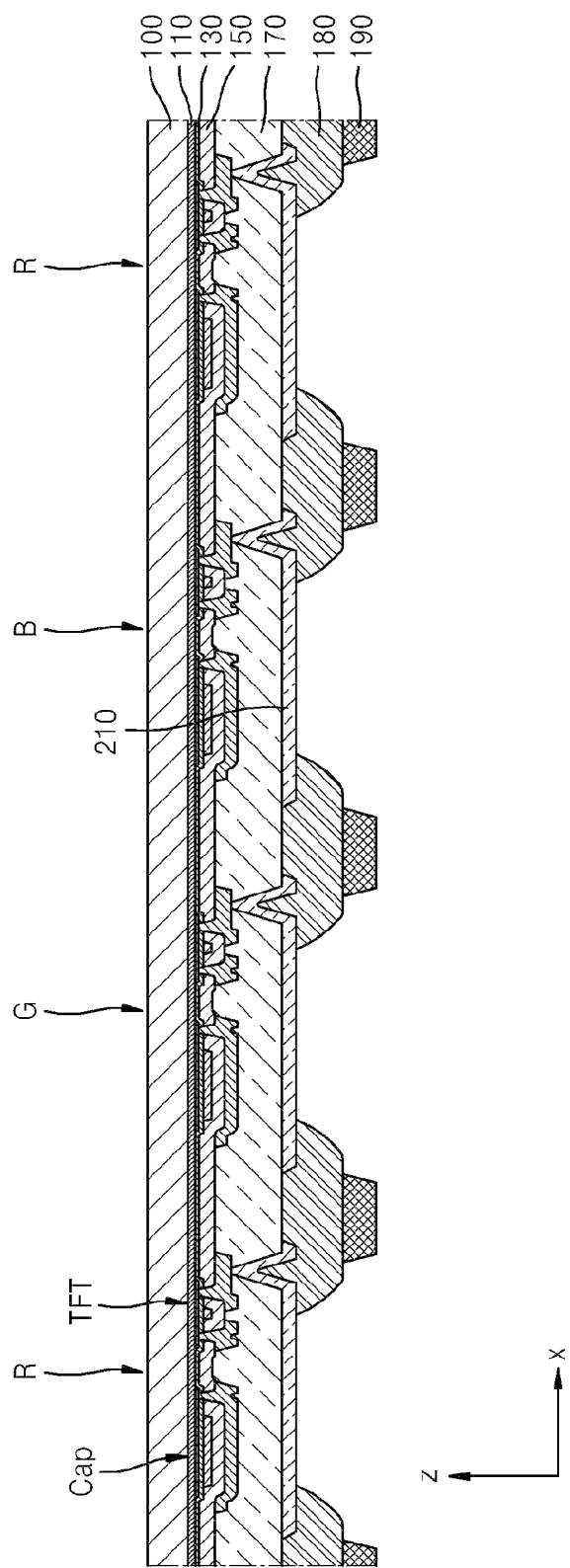
FIG. 1, FIG. 2, FIG. 3, and FIG. 4 are schematic cross-sectional views illustrating a method of manufacturing an organic light-emitting display apparatus, according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When a component, such as a layer, film, region, or plate, is referred to as being "on," "connected to," or "coupled to" another component, it may be directly on, connected to, or coupled to the other component, or intervening components may be present. When, however, a component is referred to as being "directly on," "directly connected to," or "directly coupled to" another component, there are no intervening components present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIGS. 1 through 4 are schematic cross-sectional views illustrating a method of manufacturing an organic light-emitting display apparatus, according to an exemplary embodiment of the present invention.

As shown in FIG. 1, a back plane is prepared. The back plane may include a substrate 100, pixel electrodes 210 disposed on the substrate 100, and a pixel-defining layer 180 that exposes at least portions of the pixel electrodes 210, including center portions thereof. In this case, the pixel-defining layer 180 may protrude from the back plane more than the pixel electrodes 210, with respect to the substrate 100. Spacers 190 may be disposed on the pixel-defining layer 180.

The pixel electrodes 210 may be transparent (translucent) electrodes or reflective electrodes. When the pixel electrodes 210 are transparent (translucent) electrodes, the pixel electrodes 210 may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes 210 are reflective electrodes, the pixel electrodes 210 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a film formed of ITO, IZO, ZnO or $In_2O_3$. However, structures and materials of the pixel electrodes 210 are not limited thereto and may vary.

The pixel-defining layer 180 may include openings corresponding to sub-pixels, respectively, that is, openings exposing center portions of the pixel electrodes 210 or the entire pixel electrodes 210 to define pixels. Also, the pixel-defining layer 180 may prevent arcs from occurring at ends of the pixel electrodes 210 by increasing a distance between the ends of the pixel electrodes 210 and opposite electrodes (not shown) disposed on the pixel electrodes 210.

The back plane may further include various components, as necessary. For example, a thin film transistor (TFT) or a capacitor Cap may be formed on the substrate 100, as shown in FIG. 1. In addition, the back plane may include a buffer layer 110 to prevent impurities from penetrating into a semiconductor layer of the TFT, a gate insulating layer 130 that insulates the semiconductor layer of the TFT from a gate electrode, an interlayer insulating layer 150 that insulates source/drain electrodes of the TFT from the gate electrode, a planarization layer 170 that covers the TFT and has a flat upper surface, or the like.

Figure 2:
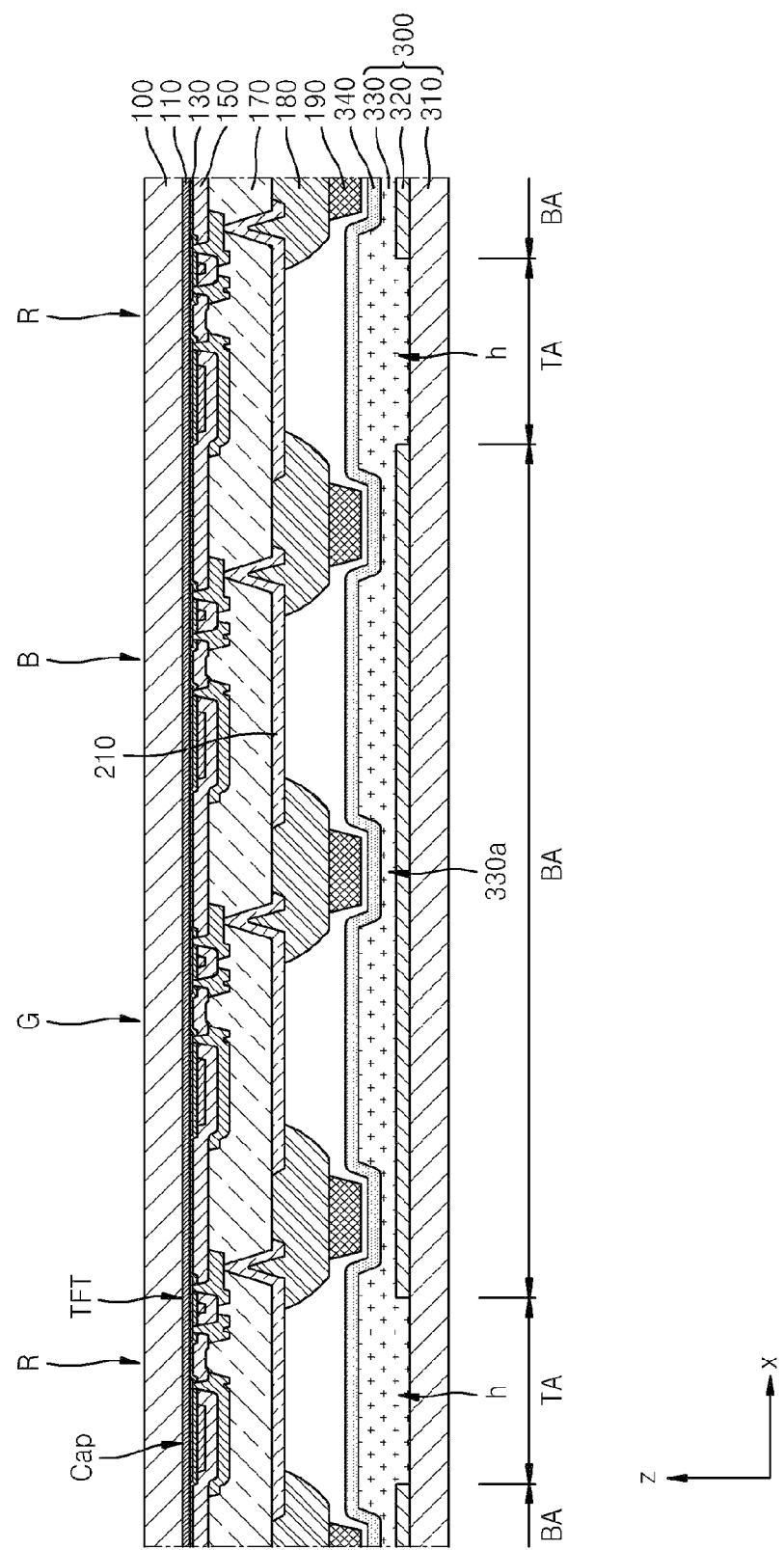

Next, as shown in FIG. 2, a donor mask 300 is prepared. The donor mask 300 may include a base substrate 310, a reflective layer 320, and a light-to-heat conversion layer 330. A transferring layer 340 may be deposited on the donor mask 300.

The preparation of the donor mask 300 and the deposition of the transferring layer 340 may be performed before preparing the back plane, after preparing the back plane, or concurrently with preparing the back plane.

The base substrate 310 forms an overall exterior of the donor mask 300 and may be formed of glass in order to transmit light to the light-to-heat conversion layer 330. The base substrate 310 may be formed of polyester, such as polyethylene terephthalate (PET), polyacryl, polyepoxy, polyethylene and/or polystyrene.

The light-to-heat conversion layer 330 absorbs flash lamp light or a laser beam when the flash lamp light or laser beam is radiated, and converts at least a part of energy of the absorbed flash lamp light or laser beam into heat. The light-to-heat conversion layer 330 may be a metal layer formed of a metal, such as aluminum or silver, capable of absorbing infrared-visible rays, an oxide/sulfide layer including the aforementioned metal, a polymer organic layer including carbon black, graphite, etc., or the like.

The light-to-heat conversion layer 330 has grooves 330a formed in one surface which faces away from the base substrate 310. Accordingly, when the transferring layer 340 is formed on the donor mask 300, a surface of the transferring layer 340, which faces away from the base substrate 310, also has grooves corresponding to the grooves 330a of the light-to-heat conversion layer 330.

The reflective layer 320 is disposed between the base substrate 310 and the light-to-heat conversion layer 330. The reflective layer 320 has through holes h. Accordingly, the reflective layer 320 has transmission areas TA aligned with the through holes h, and block areas BA corresponding to areas other than the through holes h.

The reflective layer 320 may be formed to have the through holes h by using a mask on the base substrate 310, or the reflective layer 320 may be formed by methods such as a method of forming the through holes h after forming layers having a uniform thickness and then removing parts of the layers having the uniform thickness. The reflective layer 320 may be formed by using titanium (Ti), Al, copper (Cu), molybdenum (Mo), alloys thereof, chromium nitride (CrN), TiAlCu, etc. Alternatively, the reflective layer 320 may be formed of titanium oxide ($TiO_x$), silicon dioxide ($SiO_x$), silicon carbon nitride (SiCn), etc.

The transferring layer 340 is a layer that may be vaporized, evaporated, or sublimated by heat generated in the light-to-heat conversion layer 330 and may include, for example, a light emitting material.

After preparing the donor mask 300 with the transferring layer 340 deposited thereon, the donor mask 300 is disposed so that transferring layer 340 faces the pixel electrodes 210 and the pixel-defining layer 180 of the back plane, as shown in FIG. 2.

Specifically, as shown in FIG. 2, the pixel electrodes 210 and the pixel-defining layer 180 of the back plane are arranged to face downward (in a negative Z direction), and the donor mask 300 is arranged under the back plane. If the transferring layer 340 is disposed to face the pixel electrodes 210 and the pixel-defining layer 180, the disposition position of the donor mask 300 and the disposition position of the back plane may be changed.

A hole injection layer, a hole transport layer, etc. may be formed on an entire surface of the substrate 100, before the back plane and the donor mask 300 are arranged.

As shown in FIG. 2, when the back plane and the donor mask 300 are arranged, alignment of the back plane with the donor mask 300 is performed. That is, the back plane and the donor mask 300 are aligned with each other to make transmission areas TA of the reflective layer 320 of the donor mask 300 be in alignment with predetermined areas of the back plane. In FIG. 2, the transferring layer 340 of the donor mask 300 includes a light emitting material capable of emitting red light, and thus, it the back plane and the donor mask 300 are shown to be aligned with each other to make the through holes h of the reflective layer 320 included in the donor mask 300 be in alignment with the pixel electrodes 210 of red sub-pixels R.

Figure 3:
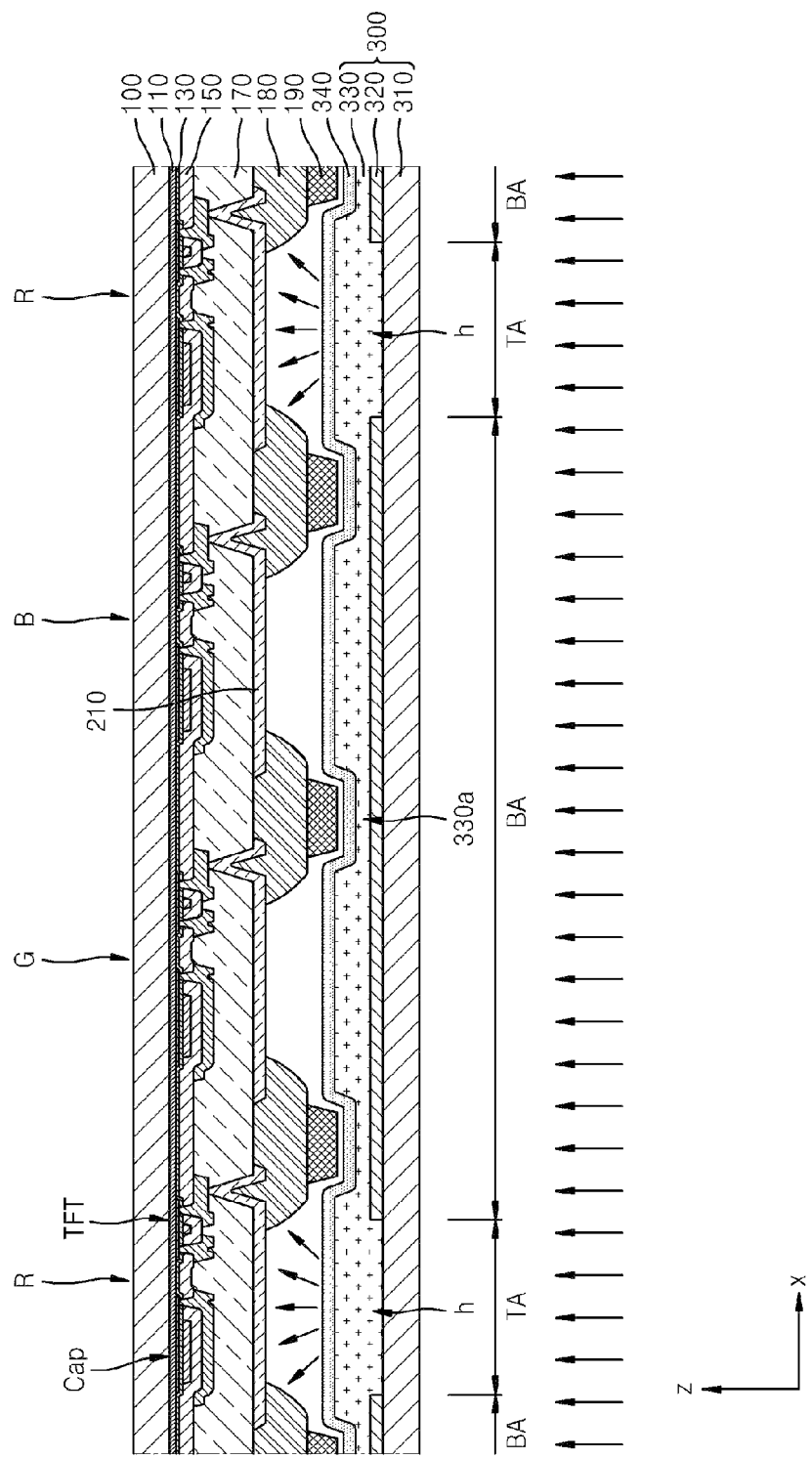
Figure 4:
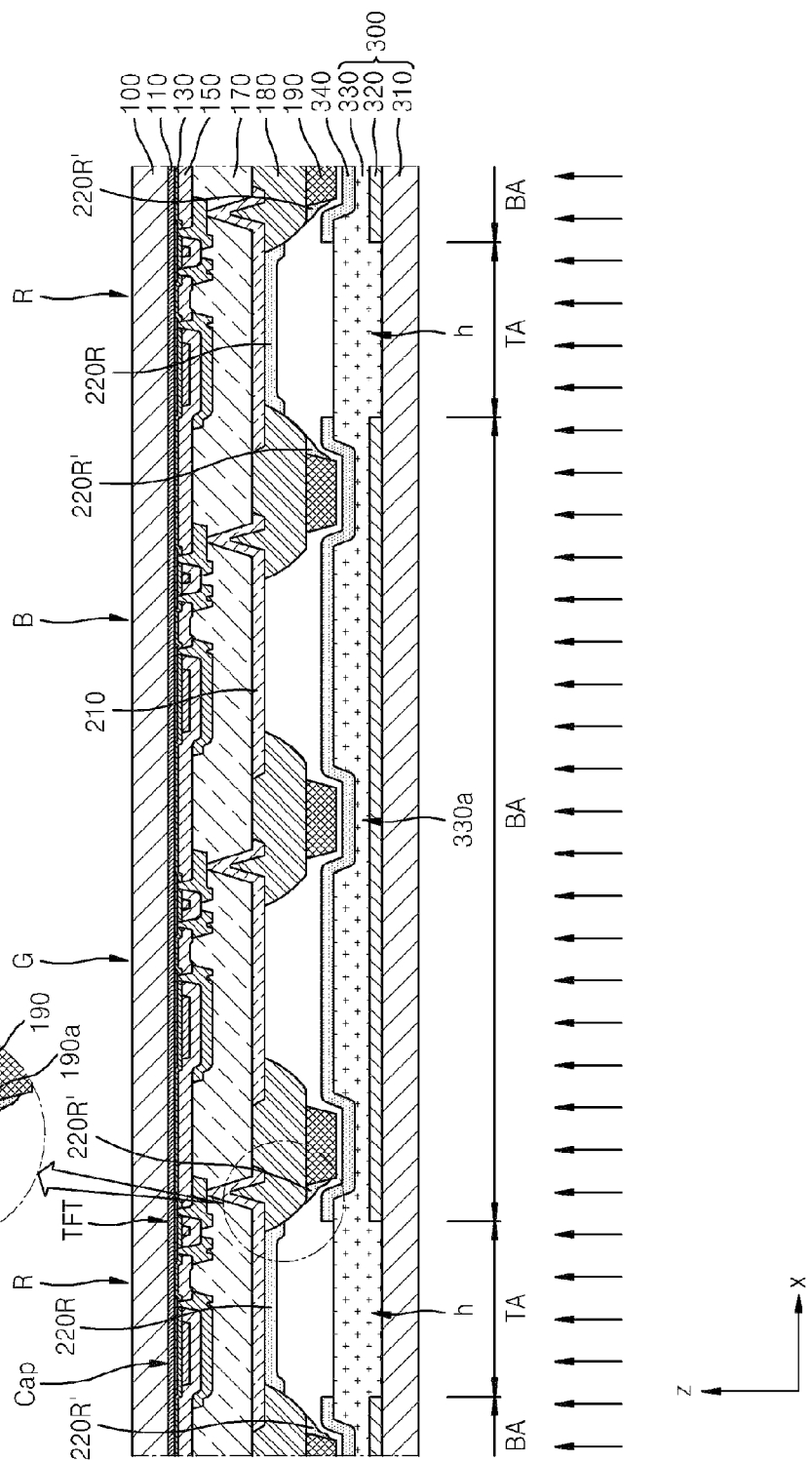

As shown in FIG. 3, a portion of the transferring layer 340 of the donor mask 300 is transferred to the back plane by radiating lamp light or a laser beam onto the donor mask 300 by using a flash lamp or a laser beam oscillator. In this case, although the lamp light or laser beam is radiated onto an entire surface of the donor mask 300 by using the flash lamp or laser beam oscillator, most of the lamp light or laser beam is blocked by the reflective layer 320 and reaches the light-to-heat conversion layer 330 only through the transmission areas TA corresponding to the through holes h or the reflective layer 320. Accordingly, only portions, which correspond to the transmission areas TA, of the transferring layer 340 of the donor mask 300 are evaporated, vaporized or sublimated, and thus, as shown in FIG. 4, a red light emitting layer 220R is formed on pixel electrodes 210 of the red sub-pixel R.

In this case, after the portions, which correspond to the transmission areas TA, of the transferring layer 340 of the donor mask 300 are evaporated, vaporized, or sublimated, the majority of the material of the evaporated, vaporized, or sublimated portions is deposited on pixel electrodes 210 of the red sub-pixel R of the back plane. However, a portion of the material may not be deposited on the pixel electrodes 210 of the red sub-pixel R, but may be deposited in other places. This is because the material of the evaporated, vaporized, or sublimated portions moves to the back plane while being spread in a radial direction after the portions of the transferring layer 340 are evaporated, vaporized or sublimated. In particular, when manufacturing a large-scaled organic light-emitting display apparatus or simultaneously manufacturing a plurality of organic light-emitting display apparatuses by using a large-scaled mother glass, an interval between the back plane and the donor mask 300 may be increased. In this case, after the portions, which correspond to the transmission areas TA, of the transferring layer 340 of the donor mask 300 are evaporated, vaporized, or sublimated, a part of the material of the evaporated, vaporized, or sublimated portions may move to adjacent pixel electrodes 210 of the green sub-pixel G or blue sub-pixel B rather than the pixel electrodes 210 of the red sub-pixel R of the back plane.

However, in the method of manufacturing an organic light-emitting display apparatus according to the present exemplary embodiment, the material moving to a place other than the pixel electrodes 210 of the red sub-pixel R may be blocked by the spacers 190 positioned on the pixel-defining layer 180 of the back plane. Accordingly, a dummy light emitting layer 220R' is formed on a side 190a of the spacer 190 in a direction toward the pixel electrodes 210.

In particular, in order to block the material moving to a place other than the pixel electrodes 210 of the red sub-pixel R, the back plane and the donor mask 300 may be aligned with each other so that the spacers 190 of the back plane face the grooves 330a of the light-to-heat conversion layer 330 when aligning the back plane with the donor mask 300. Accordingly, at least portions of the spacers 190 in the direction of the donor mask 300 (in a negative Z direction) are aligned with portions of the transferring layer 340 and positioned in the grooves 330a of the light-to-heat conversion layer 330.

Specifically, a surface of the transferring layer 340, which faces away from the base substrate 310, also has grooves aligned with the grooves 330a of the light-to-heat conversion layer 330, and thus, at least portions of the spacers 190 in the direction of the donor mask 300 (in the negative Z direction) are positioned in the grooves of the transferring layer 340 which are aligned with the grooves 330a. As a result, after the portions, which correspond to the transmission areas TA, of the transferring layer 340 of the donor mask 300 are evaporated, vaporized, or sublimated, a portion of the material of the evaporated, vaporized, or sublimated portions, which moves to other places without being deposited on the pixel electrodes 210 of the red sub-pixel R, may be positively blocked by the spacers 190.

Figure 5:
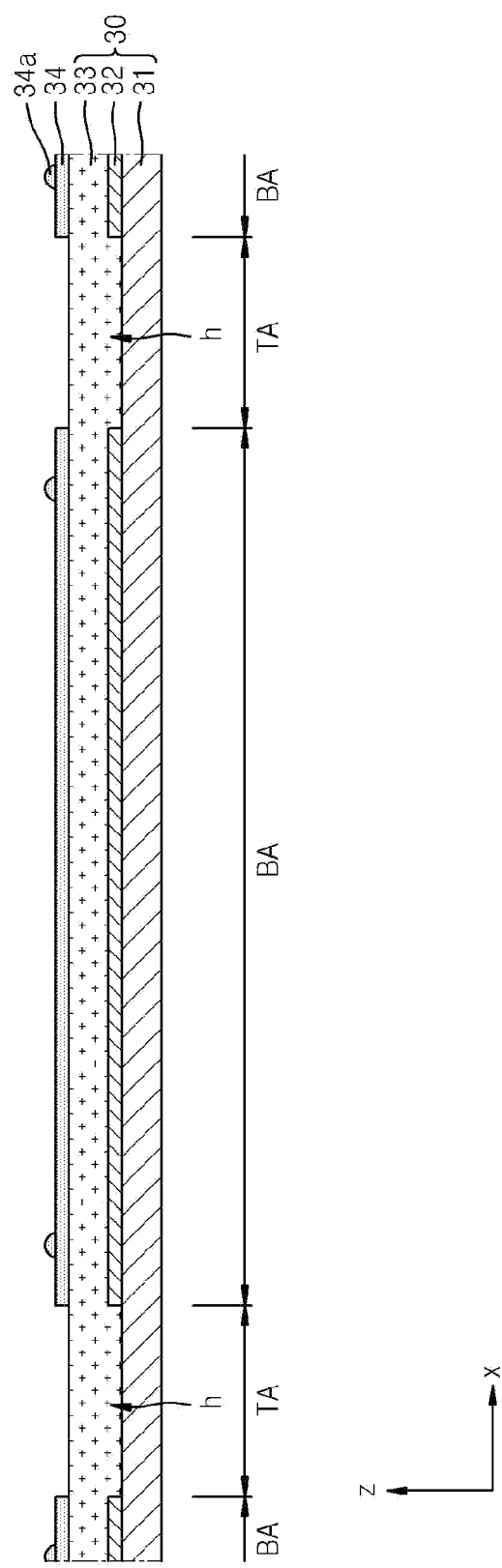
FIG. 5 is a schematic diagram illustrating a donor mask that is used in a manufacturing method according to a comparative example.

If the light-to-heat conversion layer 330 of the donor mask 300 does not have the grooves 330a, that is, a donor mask 30 has a base substrate 31, a patterned reflective layer 32, and a groove-less light-to-heat conversion layer 33, as shown in the comparative example of FIG. 5, the portions of the transferring layer 340 which correspond to the transmission areas TA are evaporated, vaporized, or sublimated, and then a part of the material of the evaporated, vaporized, or sublimated portions may be deposited on the transferring layer 34 without being deposited on the back plane. Accordingly, a surplus layer 34a is formed on the transferring layer 34, as shown in FIG. 5.

The donor mask 300 or 30 is not a single-use mask. That is, after portions of the transferring layer 340 or 34 are evaporated, vaporized, or sublimated and thus, a light emitting layer is formed on the back plane, a transferring layer 340 or 34 is formed on the donor mask 300 or 30 again to repeatedly use the donor mask 300 or 30. In the donor mask 30, which is used in a manufacturing method according to the comparative example illustrated in FIG. 5, the height of the surplus layer 34a gradually increases with repeated use of the donor mask 30, and thus, a gap between the back plane and the donor mask 30 may not be maintained.

Ideally, it is desirable to position the donor mask 300 or 30 very close to the back plane. However, as described above, when manufacturing a large-scaled organic light-emitting display apparatus or simultaneously manufacturing a plurality of organic light-emitting display apparatuses by using a large-scaled mother glass, an interval between the back plane and the donor mask 300 may be increased. Because the spacers 190 exist in the back plane, the material of the transferring layer 340 may be prevented, by means of the spacers 190, from being deposited on a pixel electrode other than a predetermined pixel electrode during the depositing of the material of the transferring layer 340 on the back plane. However, if grooves do not exist in the light-to-heat conversion layer 33 of the donor mask 30, as shown in FIG. 5, although the spacers 190 exist in the back plane, a portion of the material of the transferring layer 34 may be re-deposited on the transferring layer 34 during the depositing of the material of the transferring layer 34 on the back plane. Thus, the formation of the surplus layer 34a may not be prevented.

However, in the method of manufacturing an organic light-emitting display apparatus according to the present exemplary embodiment, the donor mask 300 having the light-to-heat conversion layer 330 with the grooves 330a formed therein is used. Accordingly, a surface of the transferring layer 340 which faces away from the base substrate 310 also has grooves corresponding to the grooves 330a of the light-to-heat conversion layer 330, and thus, at least portions of the spacers 190 in the direction of the donor mask 300 (in the negative Z direction) are positioned in the grooves of the transferring layer 340 which correspond to the grooves 330a. As a result, when the portions, which correspond to the transmission areas TA, of the transferring layer 340 of the donor mask 300 are evaporated, vaporized, or sublimated, and then the material of the evaporated, vaporized, or sublimated portions moves to other places without being deposited on the pixel electrodes 210 of the red sub-pixel R, the material may reach the sides 190a of the spacers 190 before reaching the transferring layer 340. Accordingly, it is possible to prevent the surplus layer 34a illustrated in the comparative example of FIG. 5 from being formed on the transferring layer 34, and thus, a gap between the donor mask 300 and the back plane may be maintained although repeatedly using the donor mask 300.

After the red light emitting layer 220R is formed, the donor mask 300 may be replaced, and a green light emitting layer or a blue light emitting layer may be formed on pixel electrodes 210 of a green sub-pixel G or a blue sub-pixel B. An electron injection layer, an electron transport layer, etc. may be formed as necessary, and opposite electrodes corresponding to the red sub-pixel R, green sub-pixel G, and blue sub-pixel B may be formed as necessary. Accordingly, the organic light-emitting display apparatus may be manufactured.

The grooves 330a of the light-to-heat conversion layer 330 of the donor mask 300 may be formed more deeply as necessary so that at least portions of the spacers 190 of the back plane are positioned in the grooves 330a of the light-to-heat conversion layer 330. Accordingly, a light emitting layer may be more accurately formed on the back plane, and in addition, a surplus layer may be positively prevented from being formed on the transferring layer 340 of the donor mask 300.

Figure 6:
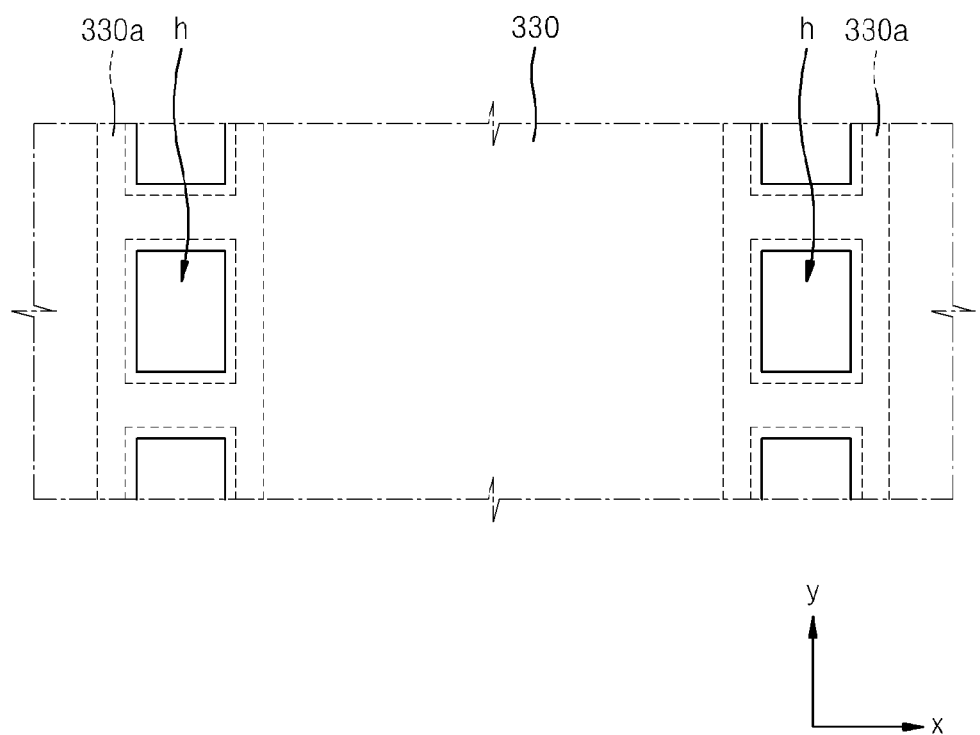
FIG. 6 is a schematic plan view illustrating a portion of a donor mask according to an exemplary embodiment of the present invention.

As described above, portions, which correspond to the through holes h, of the transferring layer 340 of the donor mask 300 are evaporated, vaporized, or sublimated, and then the material of the evaporated, vaporized, or sublimated portions is spread in a radial direction. Accordingly, the grooves 330a of the light-to-heat conversion layer 330 may be formed along a closed path surrounding the through holes h of the reflective layer 320. A case in which the grooves 330a of the light-to-heat conversion layer 330 each are formed along a closed path surrounding the through holes h of the reflective layer 320 is illustrated in FIG. 6. In this case, as shown in FIG. 6, the grooves 330a of the light-to-heat conversion layer 330 each have a shape in which each groove 330a of the light-to-heat conversion layer 330 is shared between through holes h that are adjacent in the Y axis direction. That is, each groove 330a of the light-to-heat conversion layer 330 may have a shape in which a plurality of "H" shapes are arranged upward and downward and are connected to each other.

The grooves 330a of the light-to-heat conversion layer 330 of the donor mask 300 are disposed around the through holes h of the reflective layer 320. Specifically, the grooves 330a of the light-to-heat conversion layer 330 of the donor mask 300 are positioned around the through holes h of the reflective layer 320 while being positioned to correspond to the through holes h of the reflective layer 320. This is because portions of the transferring layer 340, which correspond to the through holes h, may be evaporated, vaporized, or sublimated, and a part of the material of the evaporated, vaporized, or sublimated portions may become a surplus layer around a portion of the transferring layer 340, which corresponds to each through hole h. Accordingly, in order to prevent the surplus layer from being formed, the grooves 330a of the light-to-heat conversion layer 330 of the donor mask 300 need to be positioned around the through holes h of the reflective layer 320 while being positioned to correspond to the through holes h of the reflective layer 320.

Although in some exemplary embodiments the light-to-heat conversion layer 330 has the grooves 330a, the light-to-heat conversion layer 330 may have through holes instead of the grooves 330a in other exemplary embodiments. That is, in the method of manufacturing an organic light-emitting display apparatus, the light-to-heat conversion layer 330 of the donor mask 300 may have through holes penetrating the light-to-heat conversion layer 330. In this case, portions of the reflective layer 320 may be exposed by the through holes of the light-to-heat conversion layer 330. An adiabatic layer (not shown) may be interposed as necessary between the reflective layer 320 and the light-to-heat conversion layer 330, and in this case, a portion of the adiabatic layer may be exposed by the through holes of the light-to-heat conversion layer 330.

A method of manufacturing the organic light-emitting display apparatus has been described hereinabove, but the present invention is not limited thereto.

The donor mask 300 according to another exemplary embodiment may include the base substrate 310, the reflection layer 320, and the light-to-heat conversion layer 330 as shown in FIGS. 2 through 4 and 6. The transferring layer 340 may be formed on the light-to-heat conversion layer 330 by using a method such as deposition.

The base substrate 310 forms an overall exterior of the donor mask 300 and may be formed of glass to transmit light to the light-to-heat conversion layer 330. In some cases, the base substrate 310 may be formed of polyester, such as polyethylene terephthalate (PET), polyacryl, polyepoxy, polyethylene, and/or polystyrene.

The light-to-heat conversion layer 330 absorbs flash lamp light or a laser beam when the flash lamp light or laser beam is radiated, and converts at least a part of energy of the absorbed flash lamp light or laser beam into heat. The light-to-heat conversion layer 330 may be a metal layer formed of a metal, such as aluminum or silver, capable of absorbing infrared-visible rays, an oxide/sulfide layer including the aforementioned metal, a polymer organic layer including carbon black, graphite, etc., or the like. The light-to-heat conversion layer 330 has the grooves 330a formed in a surface thereof facing away from the base substrate 310 than the other surface.

The reflective layer 320 has a plurality of through holes h. Accordingly, the reflective layer 320 has transmission areas TA aligned with the through holes h and block areas BA corresponding to areas other than the through holes h. As shown in FIG. 2, the reflective layer 320 may have a single-layer structure, but is not limited thereto. That is, the reflective layer 320 may have a multilayer structure, as necessary. For example, the reflective layer 320 may include a light blocking layer (not shown) corresponding to the block area BA. The light blocking layer may include a metal that may block light well, a material used for a black matrix, or the like. The reflective layer 320 may have a different structure, for example, a multilayer structure in which a metal layer and an inorganic layer are included, or a multilayer structure in which inorganic layers are included.

As the donor mask 300 is used in the method of manufacturing an organic light-emitting display apparatus according to the above-described exemplary embodiment, a material for a red light emitting layer may be effectively prevented from being deposited on a pixel electrode of a sub-pixel other than the pixel electrode 210 of the red sub-pixel R when manufacturing an organic light-emitting display apparatus. In addition, while the organic light-emitting display apparatus is manufactured, the donor mask 300 may prevent a material vaporized, evaporated, or sublimated from the transferring layer 340 of the donor mask 300 from being re-deposited on the transferring layer 340 or minimize the re-deposition of the material. Accordingly, an organic light-emitting display apparatus that has a reduced occurrence rate of defects and more uniform quality may be manufactured, and a gap between the donor mask 300 and a back plane may be maintained more easily even though the donor mask 300 is repeatedly used.

Portions, which correspond to the through holes h, of the transferring layer 340 of the donor mask 300 are evaporated, vaporized, or sublimated, and then the material of the evaporated, vaporized, or sublimated portions is spread in a radial direction. Accordingly, the grooves 330a of the light-to-heat conversion layer 330 may be formed along a closed path surrounding the through holes h of the reflective layer 320. A case in which the grooves 330a of the light-to-heat conversion layer 330 each are formed along a closed path surrounding the through holes h of the reflective layer 320 is illustrated in FIG. 6. In this case, as shown in FIG. 6, the grooves 330a of the light-to-heat conversion layer 330 each have a shape in which each groove 330a of the light-to-heat conversion layer 330 is shared between through holes h that are adjacent in the Y axis direction. That is, each groove 330a of the light-to-heat conversion layer 330 may have a shape in which a plurality of "H" shapes are arranged upward and downward and are connected to each other.

The grooves 330a of the light-to-heat conversion layer 330 of the donor mask 300 are positioned around the through holes h of the reflective layer 320. Specifically, the grooves 330a of the light-to-heat conversion layer 330 of the donor mask 300 are positioned around the through holes h of the reflective layer 320 while being positioned to correspond to the through holes h of the reflective layer 320. This is because portions of the transferring layer 340, which correspond to the through holes h, may be evaporated, vaporized, or sublimated and a part of the material of the evaporated, vaporized, or sublimated portions may become a surplus layer around a portion of the transferring layer 340, which corresponds to each through hole h. Accordingly, in order to prevent the surplus layer from being formed, the grooves 330a of the light-to-heat conversion layer 330 of the donor mask 300 are positioned around the through holes h of the reflective layer 320 while being positioned to correspond to the through holes h of the reflective layer 320.

Although the light-to-heat conversion layer 330 in the donor mask 300 has the grooves 330a, the light-to-heat conversion layer 330 may have through holes instead of the grooves 330a. In this case, portions of the reflective layer 320 may be exposed by the through holes of the light-to-heat conversion layer 330. An adiabatic layer (not shown) may be interposed between the reflective layer 320 and the light-to-heat conversion layer 330, as necessary, and in this case, a portion of the adiabatic layer may be exposed by the through holes of the light-to-heat conversion layer 330.

Although the organic light-emitting display apparatus manufacturing method and the donor mask 300 used in the method have been described hereinabove, but an organic light-emitting display apparatus manufactured by using the method is also within the scope of the present invention. A portion of an organic light-emitting display apparatus according to an exemplary embodiment of the present invention may have a shape as illustrated in FIG. 4. That is, it may be understood that FIG. 4 is a schematic cross-sectional view illustrating an organic light-emitting display apparatus according to an exemplary embodiment of the present invention, except a light emitting layer formed in the green sub-pixel G or blue sub-pixel B and an opposite electrode formed to correspond to the most of entire surface of the substrate 100.

The organic light-emitting display apparatus according to the present exemplary embodiment of the present invention includes a pixel electrode 210, a pixel-defining layer 180 covering an edge of the pixel electrode 210, a spacer 190 that is positioned on the pixel-defining layer 180 and has a width less than that of the pixel-defining layer 180, a light emitting layer 220R, and a dummy light emitting layer 220R'. The light emitting layer 220R is disposed on the pixel electrode 210, and the dummy light emitting layer 220R' includes the same material as the light emitting layer 220R and is positioned on a side 190a of the spacer 190 in a direction toward the pixel electrode 210.

Because the organic light-emitting display apparatus according to the present exemplary embodiment includes the spacer 190, a material for forming the light emitting layer 220R may be effectively prevented from being formed on a sub-pixel other than the green sub-pixel R during manufacturing the organic light-emitting display apparatus. In addition, a material that may form a surplus layer may be deposited the side 190a of the spacer 190 in the direction of the pixel electrode 210 so that the surplus layer is not formed on the transferring layer 340 of the donor mask 300 which is used in the manufacturing process of the organic light-emitting display apparatus. Accordingly, the donor mask 300 may be repeatedly used in manufacturing the organic light-emitting display apparatus.

Figure 7:
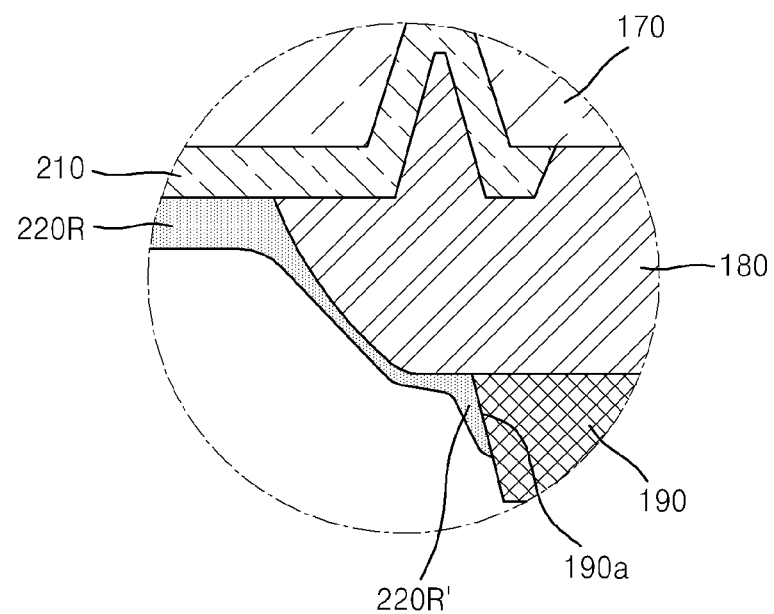
FIG. 7 is a schematic cross-sectional view illustrating a portion of an organic light-emitting display apparatus according to an exemplary embodiment of the present invention.

The material that may form a surplus layer may reach a portion of the pixel-defining layer 180 as well as the side 190a of the spacer 190. In this case, the dummy light emitting layer 220R' on the side 190a of the spacer 190 may extend across the pixel-defining layer 180, as shown in FIG. 4. In some cases, the dummy light emitting layer 220R' and the light emitting layer 220R may be connected to each other to thereby form a single body, as shown in FIG. 7. In this case, the thickness of the dummy light emitting layer 220R' on the side 190a of the spacer 190 and/or the pixel-defining layer 180 may be less than that of the light emitting layer 220R on the pixel electrode 210. This is because the dummy light emitting layer 220R' is a layer incidentally formed with a material partially radiated to the outside in the process of forming the light emitting layer 220R.

The spacer 190 may extend along a closed path surrounding the pixel electrode 210 because when manufacturing the organic light-emitting display apparatus, a portion of the transferring layer 340 of the donor mask 300 is vaporized, evaporated, or sublimated, and then a material of the vaporized, evaporated, or sublimated portion moves to the back plane while being spread in a radial direction. Accordingly, in order to block the material spreading in the radial direction, the spacer 190 may extend along the closed path surrounding the pixel electrode 210. In this case, the spacer 190 may be formed around the pixel electrode 210.

Although the pixel-defining layer 180 and the spacer 190 illustrated in FIG. 4 are separated from each other, the pixel-defining layer 180 and the spacer 190 may be formed as a single body according to necessity.

As described above, according to the exemplary embodiments described above, a donor mask that facilitates manufacture of an organic light-emitting display apparatus that has a reduced occurrence rate of defects and uniform quality, a method of manufacturing an organic light-emitting display apparatus by using the donor mask, and an organic light-emitting display apparatus may be implemented. Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light-emitting display apparatus, the method comprising:
    preparing a substrate on which a plurality of pixel electrodes are formed;
    preparing a donor mask comprising a base substrate, a single light-to-heat conversion layer disposed on the base substrate to correspond to the entire surface of the base substrate and having a groove formed in a surface facing away from the base substrate, and a reflective layer interposed between the base substrate and the light-to-heat conversion layer, the entire light-to-heat conversion layer having light absorbing properties, the reflective layer having a through hole that does not overlap the groove;
    depositing a transferring layer on the light-to-heat conversion layer of the donor mask;
    aligning the donor mask with the substrate; and
    transferring a part of the transferring layer corresponding to the through hole onto at least a portion of the plurality of pixel electrodes formed on the substrate.

2. The method of claim 1, further comprising:
    forming a pixel-defining layer covering an edge of each of the pixel electrodes; and
    forming a spacer on the pixel-defining layer,
    wherein the aligning comprises aligning the donor mask with the substrate so that the spacer is aligned with the opening or groove of the light-to-heat conversion layer.

3. The method of claim 2, wherein the aligning comprises aligning the donor mask with the substrate so that at least a portion of the spacer is positioned on a part of the transferring layer in the opening or groove of the light-to-heat conversion layer.

4. The method of claim 2, wherein the aligning comprises aligning the donor mask with the substrate so that at least a portion of the spacer is positioned in the opening or groove of the light-to-heat conversion layer.

5. The method of claim 1, wherein the opening or the groove is formed along a closed path surrounding the through hole.

6. The method of claim 5, wherein the opening or the groove is positioned around the through hole.

7. The method of claim 5, wherein the opening or the groove is positioned around the through hole and is positioned to correspond to the through hole.

* * * * *